(12) United States Patent
Yabuzaki

(10) Patent No.: US 10,469,064 B2
(45) Date of Patent: Nov. 5, 2019

(54) POWER CONVERTER

(71) Applicant: FUJI ELECTRIC CO., LTD., Kawasaki-shi, Kanagawa (JP)

(72) Inventor: Jun Yabuzaki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/016,896

(22) Filed: Jun. 25, 2018

(65) Prior Publication Data

US 2019/0044505 A1    Feb. 7, 2019

(30) Foreign Application Priority Data

Aug. 7, 2017  (JP) ................. 2017-152268

(51) Int. Cl.

| H03K 7/08 | (2006.01) |
|---|---|
| H02M 7/5387 | (2007.01) |
| H02M 3/157 | (2006.01) |
| G01R 19/252 | (2006.01) |
| H03K 19/0175 | (2006.01) |

(Continued)

(52) U.S. Cl.
CPC .............. *H03K 7/08* (2013.01); *G01R 19/252* (2013.01); *H02M 3/157* (2013.01); *H02M 3/33523* (2013.01); *H02M 3/33561* (2013.01); *H02M 7/53873* (2013.01); *H03K 19/0175* (2013.01); *H02M 2001/0003* (2013.01)

(58) Field of Classification Search
CPC ........ G01R 19/00; G01R 19/252; G11C 5/00; G11C 5/147; G06F 1/00; G06F 1/32; G06F 1/3203; G06F 1/3296; H02M 2001/00; H02M 2001/0003; H02M 3/00; H02M 3/157; H02M 7/00; H02M 7/53873; H03K 7/00; H03K 7/08; H03K 19/00; H03K 19/0016; H03K 19/0175

USPC .......................................... 327/544
See application file for complete search history.

(56) References Cited

U.S. PATENT DOCUMENTS

| 9,705,485 B1* | 7/2017 | Finfter .................... H03K 7/08 |
|---|---|---|
| 2011/0032008 A1* | 2/2011 | Zhao ....................... H03K 7/08 327/114 |

(Continued)

FOREIGN PATENT DOCUMENTS

JP    4-306725    10/1992

OTHER PUBLICATIONS

"CDM10V: Flexible 0-10V Dimming Solution", CDM10V Data Sheet, Infineon Technologies AG, Aug. 1, 2016, pp. 22.

*Primary Examiner* — Lincoln D Donovan
*Assistant Examiner* — Dave Mattison

(57) ABSTRACT

A signal converter circuit includes a frequency detection circuit configured to determine whether an external control signal is a PWM signal. A PWM frequency converter circuit is configured to detect, when a PWM signal is input, a duty cycle of the PWM signal and to generate a first digital signal. An AD converter is configured to generate a second digital signal based on an input DC voltage or a voltage attributable to a variable resistor to digital data using a maximum AD convertible input voltage as a duty cycle of 100%. An output signal generation circuit is configured to generate, based on the first or second digital signals output from the PWM frequency converter circuit or the AD converter, a PWM signal with a duty cycle based on that first or second digital signals.

13 Claims, 10 Drawing Sheets

(51) Int. Cl.
*H02M 3/335* (2006.01)
*H02M 1/00* (2006.01)

(56) References Cited

U.S. PATENT DOCUMENTS

| | | | |
|---|---|---|---|
| 2013/0229268 A1* | 9/2013 | Covaro | H03K 7/08 |
| | | | 340/12.16 |
| 2014/0016363 A1* | 1/2014 | Chen | H02M 3/335 |
| | | | 363/21.02 |
| 2014/0210445 A1* | 7/2014 | Hasegawa | H04W 48/04 |
| | | | 323/284 |

* cited by examiner

POWER CONVERTER

CROSS-REFERENCE TO RELATED APPLICATION

This application is based upon and claims the benefit of priority of the prior Japanese Patent Application No. 2017-152268, filed on Aug. 7, 2017, the entire contents of which are incorporated herein by reference.

BACKGROUND

1. Field

The embodiment discussed herein is related to a power converter for supporting input signals in various formats, used as external control signals for adjusting its output voltage or electric current.

2. Related Art

Semiconductor devices allowing analog and digital signals to be input as external control signals to a common input terminal are conventionally known (for example, see Japanese Laid-open Patent Publication No. 04-306725). Japanese Laid-open Patent Publication No. 04-306725 describes a semiconductor device with an analog signal input circuit and a digital signal input circuit connected in parallel to each other, both of which are connected to a common input terminal so as to input an external control signal in parallel. Herewith, each of the input circuits independently detects a digital signal or an analog signal.

Power converters, such as driver integrated circuits (ICs) for driving light-emitting diodes (LEDs), with a built-in dimmer function, are an example of semiconductor devices supporting inputs of both analog and digital signals. Such power converters are compatible with both analog and digital external control signals for dimming control. A direct-current (DC) voltage applied to a dimming input terminal and a voltage drop due to a variable resistor connected to the input terminal are examples of the analog external control signals while a pulse width modulation (PWM) signal is an example of the digital external control signals.

FIG. 10 is a circuit diagram illustrating a configuration example of a conventional input circuit to which an analog or digital signal is input.

A conventional semiconductor device includes a dimming input terminal Dim. A first terminal of the dimming input terminal Dim is connected to the cathode of a diode 101, whose anode is connected to a first terminal of a capacitor 102. The other second terminal of the capacitor 102 is connected to the other second terminal of the dimming input terminal Dim. The first and second terminals of the capacitor 102 are also connected to a signal converter circuit 103.

The signal converter circuit 103 includes a resistor 104, a first terminal of which is connected to the first terminal of the capacitor 102. The other second terminal of the resistor 104 is connected to a first terminal of a capacitor 105, whose other second terminal is connected to the second terminal of the capacitor 102. The resistor 104 and the capacitor 105 form a low-pass filter 106.

A connecting point of the resistor 104 and the capacitor 105 is connected to a non-inverting input terminal of an operational amplifier 107, whose output terminal is connected to its inverting input terminal. This allows the operational amplifier 107 to function as a voltage follower whose input is the output of the low-pass filter 106. The output terminal of the operational amplifier 107 is connected to a first terminal of a resistor 108, whose other second terminal is connected to an output terminal of the signal converter circuit 103. Herewith, the operational amplifier 107 forms a circuit that outputs, via the resistor 108, a signal whose voltage is equivalent to the output of the low-pass filter 106.

The first terminal of the resistor 104 of the low-pass filter 106 is also connected to a first terminal of a resistor 111, whose other second terminal is connected to a positive electrode power feeding terminal 112. The second terminal of the capacitor 105 of the low-pass filter 106 is connected to a negative electrode power feeding terminal 113. Then, the positive electrode power feeding terminal 112 is connected to a positive electrode terminal of a smoothing capacitor 114 while the negative electrode power feeding terminal 113 is connected to a negative electrode terminal of the capacitor 114.

There are three types of external control signals Cont-sig to be input to the dimming input terminal Dim: DC voltage, variable resistor, and PWM signal types. When a DC voltage is input to the dimming input terminal Dim as the external control signal Cont-sig, a voltage Vcont across the capacitor 102 charged by the power feeding terminal 112 via the resistor 111 approximates the value of the DC voltage (the voltage Vcont differs only by a forward voltage of the diode 101). The voltage Vcont across the capacitor 102 is applied to the non-inverting input terminal of the operational amplifier 107 via the low-pass filter 106, and the operational amplifier 107 then outputs a signal with a voltage equivalent to the output voltage of the low-pass filter 106 from the output terminal 110 of the signal converter circuit 103 via the resistor 108.

When a variable resistor is connected to the dimming input terminal Dim to provide the external control signal Cont-sig, an electric current flows through the variable resistor from the power feeding terminal 112 via the resistor 111 and the diode 101. Herewith, under steady state condition, a voltage according to the resistances of the variable resistor and the resistor 111 and a voltage between the power feeding terminals 112 and 113 is generated across the variable resistor. In the case of employing the variable resistor, a signal whose voltage approximates a voltage applied to the dimming input terminal Dim (the approximating voltage differs only by the forward voltage of the diode 101) is output from the output terminal 110 of the signal converter circuit 103 via the resistor 108, as in the case above where the DC voltage is input.

When a PWM signal is input as the external control signal Cont-sig, the voltage Vcont across the capacitor 102 changes between the potential of the power feeding terminal 112 and the potential of the power feeding terminal 113 according to whether the PWM signal is at high (HIGH) or low (LOW) level. In this case, when the PWM signal is at HIGH level, the capacitor 102 is charged via the resistor 111. On the other hand, when the PWM signal is at LOW level, the capacitor 102 is discharged via the diode 101. The voltage changed across the capacitor 102 is fed to the low-pass filter 106, which then averages the PWM signal and outputs a voltage signal whose value corresponds to the duty cycle of the PWM signal. The voltage signal is applied to the non-inverting input terminal of the operational amplifier 107, and a signal with a voltage equivalent to the output voltage of the low-pass filter 106 is output from the output terminal 110 of the signal converter circuit 103 via the resistor 108.

The signal converter circuit 103 outputs a voltage signal whose value corresponds to the external control signal Cont-sig in any of the above-mentioned cases, i.e. the case of applying a DC voltage, the case of connecting a variable resistor, and the case of applying a PWM signal, in order to provide the external control signal Cont-sig. In a power converter with a built-in dimmer function, the voltage signal output from the signal converter circuit 103 is used as a signal for dimming control to thereby control an output voltage or electric current.

As for the signal converter circuit of the above-described power converter, in the case where the external control signal is a PWM signal, the voltage of the PWM signal needs to be smoothed and the low-pass filter is employed to achieve this end. This filter needs to be designed to smooth out noise spikes even at the lowest frequency, 100 Hz. If sufficient smoothing is not provided, the output voltage or electric current of the power converter repeats rising and falling in response to the external control signal and does not therefore remain constant. In addition, because the smoothing slows down the startup of the power converter, achieving sufficient smoothing of the PWM signal while shortening the startup time is of great difficulty. Further, the voltage value of the PWM signal at HIGH level input thereto has an effect on the output voltage or electric current. That is, in the case of a PWM signal being input, it is desired to use the duty cycle of the PWM signal to adjust the output voltage or electric current. However, the value obtained after the PWM signal passes through the low-pass filter varies also with the voltage value of the input PWM signal at HIGH level even if the duty cycle of the PWM signal remains the same. Thus, there remains the problem of not being able to obtain a value accurately reflecting the duty cycle.

SUMMARY

According to an aspect, there is provided a power converter including a signal converter circuit configured to receive an external control signal in a form of a pulse width modulation signal or a direct-current voltage and adjust a threshold used by a feedback circuit to detect an output voltage or electric current to be supplied to a load. The signal converter circuit includes a frequency detection circuit configured to determine whether the external control signal is in the form of the pulse width modulation signal; a pulse width modulation frequency converter circuit configured to detect a duty cycle of the pulse width modulation signal and convert information on the detected duty cycle into a first digital signal; an analog-to-digital converter configured to convert information on a ratio of the direct-current voltage to a maximum analog-to-digital convertible input voltage into a second digital signal; a multiplexer configured to select the first digital signal of the pulse width modulation frequency converter circuit when the frequency detection circuit determines that the external control signal is in the form of the pulse width modulation signal, and select the second digital signal of the analog-to-digital converter when the frequency detection circuit determines that the external control signal is not in the form of the pulse width modulation signal; and an output signal generation circuit configured to generate an output signal in the form of the pulse width modulation signal, with a duty cycle indicated by the information on the detected duty cycle provided in the first digital signal when the first digital signal is selected by the multiplexer and generate an output signal in the form of the pulse width modulation signal, with a duty cycle indicated by the information on the ratio provided in the second digital signal when the second digital signal is selected by the multiplexer, and supply the output signal to the feedback circuit.

Additional aspects and/or advantages will be set forth in part in the description which follows and, in part, will be apparent from the description, or may be learned by practice of the invention.

It is to be understood that both the foregoing general description and the following description of embodiments provide illustrative examples and explanations and are not restrictive of the claimed invention.

DESCRIPTION OF EMBODIMENTS

Figure 1:
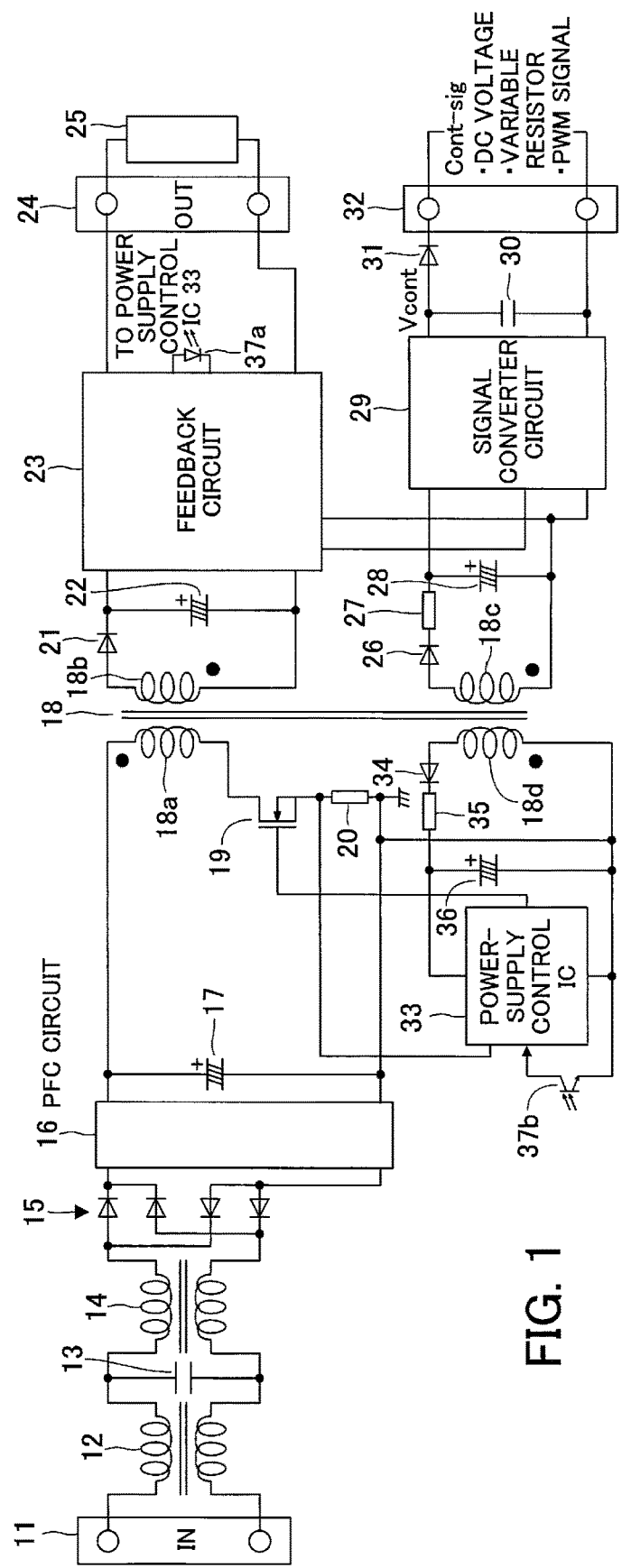
FIG. 1 illustrates an overall structure of a power converter according to a preferred embodiment.

A preferred embodiment directed to a power converter for supporting input signals in various formats, used as external control signals for adjusting its output voltage or electric current will now be described in detail with reference to the accompanying drawings, wherein like reference numerals refer to like elements throughout. Note that, in the following description, the same reference numeral may be used to refer to the name of each terminal and a voltage, signal and the like at the terminal.

FIG. 1 illustrates an overall structure of the power converter according to the preferred embodiment.

The power converter has an alternating-current (AC) input terminal 11 to be connected to a commercially available AC power supply, and a choke coil 12, an X capacitor 13, and a choke coil 14 making up a noise filter are connected to the AC input terminal 11. To the choke coil 14, a diode bridge 15 for performing full-wave rectification on an AC voltage after passing through the noise filter is connected.

The diode bridge 15 is connected to a power factor correction (PFC) circuit 16. The PFC circuit 16 is designed to improve the power factor which is reduced during power conversion in the case where the current is phase-shifted from the voltage due to an inductive or capacitive load being connected. The PFC circuit 16 rectifies and boosts the rectified voltage output from the diode bridge 15 to thereby output a fixed high direct-current (DC) voltage.

A capacitor 17 is connected to the output of the PFC circuit 16 to provide a stable supply of energy to a circuit for switching operation and also reduce switching noise caused by the switching operation. To the capacitor 17, a series circuit formed of a primary winding 18a of a transformer 18, a switching element 19, and a current detection resistor 20 is connected in parallel. As the switching element 19, a metal oxide semiconductor field effect transistor (MOSFET) is used here.

To a secondary winding 18b of the transformer 18, a rectifier smoothing circuit formed of a diode 21 and a capacitor 22 is connected. Both terminals of the capacitor 22 are connected to a DC output terminal 24 via a feedback circuit 23. To the DC output terminal 24, a load 25 is connected.

The transformer 18 also includes another secondary winding 18c, to which a rectifier smoothing circuit formed of a diode 26, a resistor 27, and a capacitor 28 is connected. Both terminals of the capacitor 28 are connected to a signal converter circuit 29 to provide power supply therefor. A capacitor 30 is connected to the input of the signal converter circuit 29. A first terminal of the capacitor 30 is connected to the anode of a diode 31, the cathode of which and the other second terminal of the capacitor 30 are connected to a control signal input terminal 32 for receiving the external control signal Cont-sig. Three types of external control signal Cont-sig are considered here: DC voltage, variable resistor, and PWM signal types. The output of the signal converter circuit 29 is connected to the feedback circuit 23.

A gate of the switching element 19 is connected to the output of a power supply control IC 33. The power supply control IC 33 is fed by a power supply circuit formed of an auxiliary winding 18d of the transformer 18 and a rectifier smoothing circuit including a diode 34, a resistor 35, and a capacitor 36.

The power supply control IC 33 is connected to a connecting point of a source of the switching element 19 and the current detection resistor 20. The power supply control IC 33 receives a voltage across the current detection resistor 20 as a feedback signal in current-mode control, and also applies the across voltage to provide overcurrent protection. The overcurrent protection function of the power supply control IC 33 is designed to stop the switching operation of the switching element 19 to thereby protect the switching element 19 from damage caused by overcurrent when a voltage indicating that an overcurrent higher than or equal to a predetermined value has passed through the switching element 19 is detected across the current detection resistor 20.

The power supply control IC 33 is also connected to the feedback circuit 23 by a photocoupler. That is, the feedback circuit 23 is provided with an LED 37a while the power supply control IC 33 is provided with a phototransistor 37b for receiving light emissions from the LED 37a. Herewith, the feedback circuit 23 is able to detect the output voltage and electric current supplied to the load 25 and give feedback to the power supply control IC 33. Based on signals fed back from the feedback circuit 23, the power supply control IC 33 performs switching control of the switching element 19 in such a manner that the output voltage and electric current have values indicated by the external control signal Cont-sig.

Note that an LED used for lighting is an example of the load needing adjustment of the output voltage or electric current by the external control signal Cont-sig, and in that case, the external control signal Cont-sig is used for dimming control of the LED.

Next described is a case where the power converter with the above-described configuration adjusts the output voltage or electric current according to the external control signal Cont-sig. Note that the following description focuses on the feedback circuit 23 and the signal converter circuit 29. Since the rest of the configuration is the same as that of FIG. 1, their detailed explanations are omitted.

Figure 2:
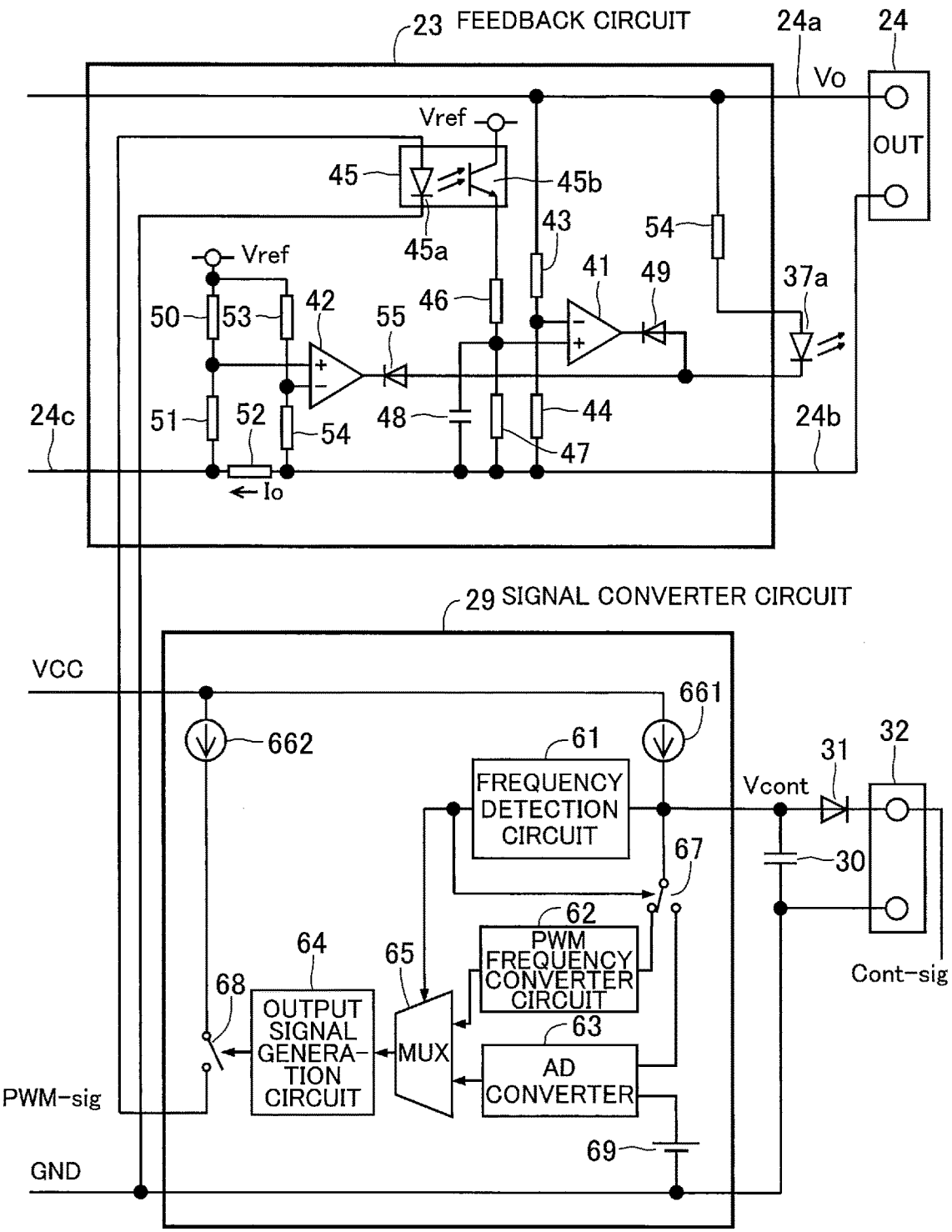
FIG. 2 is a circuit diagram illustrating a feedback circuit and a signal converter circuit of the power converter having an output voltage adjustment function.

FIG. 2 is a circuit diagram illustrating the feedback circuit and the signal converter circuit of the power converter having an output voltage adjustment function. Note that, in FIG. 2, like reference numerals are given to like components illustrated in FIG. 1, and the detailed description thereof will be omitted.

The feedback circuit 23 includes operational amplifiers 41 and 42. An inverting input terminal of the operational amplifier 41 is connected to an output terminal of a voltage divider circuit formed of resistors 43 and 44. A first terminal of the resistor 43 is connected to a line 24a which is connected to a positive electrode terminal of a DC output terminal 24. The other second terminal of the resistor 43 is connected to the inverting input terminal of the operational amplifier 41 and a first terminal of the resistor 44. The other second terminal of the resistor 44 is connected to a line 24b which is connected to a negative electrode terminal of the DC output terminal 24. Herewith, a voltage proportional to an output voltage Vo is applied to the inverting input terminal of the operational amplifier 41.

On the other hand, a non-inverting input terminal of the operational amplifier 41 is connected to a variable reference voltage source formed of a photocoupler 45, resistors 46 and 47, and a capacitor 48. A collector of a phototransistor 45b of the photocoupler 45 is connected to a line for supplying a voltage Vref (hereinafter referred to as "voltage Vref line"), and an emitter of the phototransistor 45b is connected to a first terminal of the resistor 46. The other second terminal of the resistor 46 is connected to the non-inverting input terminal of the operational amplifier 41 and a first terminal of the resistor 47, whose other second terminal is connected to the line 24b. The capacitor 48 is connected in parallel to the resistor 47.

An output terminal of the operational amplifier 41 is connected to the cathode of a diode 49. Note that the operational amplifier 41, the resistors 43, 44, 46, and 47, the phototransistor 45b, the capacitor 48, and the diode 49 make up a voltage error amplifier for detecting the difference, i.e., error, between a desired output voltage and the actual output voltage Vo. The higher the output voltage Vo, the lower the output voltage of the voltage error amplifier.

A non-inverting input terminal of the operational amplifier 42 is connected to a series circuit formed of resistors 50 and 51. A first terminal of the resistor 50 is connected to the voltage Vref line, and the other second terminal of the resistor 50 is connected to the non-inverting input terminal of the operational amplifier 42 and a first terminal of the resistor 51. The other second terminal of the resistor 51 is connected to a line 24c which is connected to the negative electrode terminal of the capacitor 22. The second terminal of the resistor 51 is also connected to a first terminal of a current detection resistor 52.

An inverting input terminal of the operational amplifier 42 is connected to a series circuit formed of resistors 53 and 54. A first terminal of the resistor 53 is connected to the voltage Vref line, and the other second terminal of the resistor 53 is connected to the inverting input terminal of the operational amplifier 42 and a first terminal of the resistor 54. The other second terminal of the resistor 54 is connected to the line 24b which is connected to the other second terminal of the current detection resistor 52.

The operational amplifier 42 is designed to compare a voltage across the current detection resistor 52 with a reference voltage. That is, because the zero potential of the input voltage of the operational amplifier 42 is the electric potential of the line 24b, the operational amplifier 42 compares a reference voltage obtained by dividing the voltage Vref by the resistors 53 and 54 with a voltage obtained by level-shifting the voltage of the line 24c (negative voltage), which corresponds to an output current Io, using the series circuit formed of the resistors 50 and 51. The voltage obtained by the level-shifting is a positive voltage and becomes lower when the output current Io is higher.

An output terminal of the operational amplifier 42 is connected to the cathode of a diode 55. Note that the operational amplifier 42, the resistors 50, 51, 53, and 54, the current detection resistor 52, and the diode 55 make up a current error amplifier for comparing a desired output current and the actual output current Io as described above. The higher the output current Io, the lower the output voltage of the current error amplifier.

The anode of the diode 49 of the voltage error amplifier and the anode of the diode 55 of the current error amplifier are connected to the cathode of a LED 37a of a photocoupler for feeding error signals back to the power supply control IC 33. The anode of the LED 37a is connected to a first terminal of a resistor 54, whose other second terminal is connected to the line 24a of the positive electrode terminal of the DC output terminal 24.

According to the feedback circuit 23, the operational amplifier 41 compares the voltage obtained by dividing the output voltage Vo with the voltage (threshold) of the variable reference voltage source. On this occasion, the voltage of the variable reference voltage source has a value according to an output signal PWM-sig output from the signal converter circuit 29. Because the output signal PWM-sig is a PWM signal, an electric current supplied by the phototransistor 45b to the resistor 46 also has a PWM waveform. A voltage occurring across the resistor 47 upon the PWM waveform current flowing through the resistors 46 and 47 is averaged by the capacitor 48 and then applied to the non-inverting input terminal of the operational amplifier 41 as the reference voltage (threshold).

The operational amplifier 41 has a phase compensation circuit (not illustrated), and the output of the operational amplifier 41 rises and falls according to a differential voltage between the voltage obtained by dividing the output voltage Vo and the reference voltage. The output of the operational amplifier 41 rises when the reference voltage is higher and falls when the voltage obtained by dividing the output voltage Vo is higher. In addition, when the absolute value of the differential voltage is larger, the output of the operational amplifier 41 undergoes faster changes. The lower the output voltage of the operational amplifier 41, the higher the amount of light emitted from the LED 37a while the higher the output voltage, the lower the amount of light emitted from the LED 37a. The output of the operational amplifier 41 is then fed back to the power supply control IC 33.

The operational amplifier 42 compares the voltage across the current detection resistor 52 with the reference voltage applied to its inverting input terminal, as described above. When the voltage across the current detection resistor 52 is lower than the reference voltage, the operational amplifier 42 outputs a voltage signal at a high level. Therefore, the diode 55 receiving the output is inversely biased and then turns off. On the other hand, when the voltage across the current detection resistor 52 is higher than the reference voltage, the operational amplifier 42 outputs a voltage signal at a low level, which turns on the diode 55 receiving the output to pass an electric current to the LED 37a and cause the LED 37a to emit light and is then fed back to the power supply control IC 33.

Note that because the diode 49 at the output of the operational amplifier 41 and the diode 55 at the output of the operational amplifier 42 are tied together to form a wired-OR, an electric current based on a lower voltage between the output of the operational amplifier 41 and the output of the operational amplifier 42 flows through the LED 37a. The higher the amount of light emitted from the LED 37a, the lower the on-resistance of the phototransistor 37b, and the voltage fed back to the power supply control IC 33 is therefore lower. The power supply control IC 33 supplies less energy from the primary side of the transformer 18 to its secondary side as the voltage fed back is lower.

In the above-described feedback circuit having the voltage error amplifier and the current error amplifier, a constant output voltage is generated by the voltage error amplifier during normal operation where the output current is less than or equal to a maximum allowable value. On the other hand, in an abnormal condition where the output current exceeds the maximum allowable value, control is exercised in such a manner as to keep the output current equal to or below the maximum allowable value while giving up control of the output voltage. Note that the following modification may also be acceptable. That is, the two error amplifiers are configured in such a manner that the output of the voltage error amplifier is higher than the output of the current error amplifier during normal operation, and control of the output current is exercised under normal conditions. Once an abnormal condition occurs where the output voltage exceeds a maximum allowable value, control is exercised in such a manner as to keep the output voltage equal to or below the maximum allowable value while giving up control of the output current.

The signal converter circuit 29 includes a frequency detection circuit 61, a PWM frequency converter circuit 62, an analog-to-digital (AD) converter 63, an output signal generation circuit 64, a multiplexer 65, constant current sources 661 and 662, switches 67 and 68, and a voltage source 69. Note that, according to this embodiment, an input to the output signal generation circuit 64 is switched by the multiplexer 65 which operates according to an output signal of the frequency detection circuit 61, and an input to the AD converter 63 is switched by the switch 67 which operates also according to the output signal of the frequency detection circuit 61. However, the switch 67 is provided to prevent mutual interference of signals input to the PWM frequency converter circuit 62 and the AD converter 63, and it is therefore not indispensable.

The input of the signal converter circuit 29 is connected to the anode of the diode 31, whose cathode is connected to the control signal input terminal 32. The diode 31 is provided to prevent unexpected electric currents from flowing through the signal converter circuit 29 from the control signal input terminal 32. Such unexpected electric current surges may occur because the external control signal Cont-sig may be generated by a different power supply unit other than the power supply of the signal converter circuit 29, and in that case, the external control signal Cont-sig may have a higher voltage than a voltage VCC of the power supply of the signal converter circuit 29. In addition, the capacitor 30 connected to the input of the signal converter circuit 29 is provided to remove noise arising when a PWM signal is input as the external control signal Cont-sig.

The input of the frequency detection circuit 61 is connected to the input of the signal converter circuit 29 and a first terminal of the constant current source 661, whose other second terminal is connected to a line for supplying the voltage VCC of the power supply. The input of the frequency detection circuit 61 is also connected to a moving contact terminal of the switch 67, whose control terminal is connected to the output of the frequency detection circuit 61. The output of the frequency detection circuit 61 is also connected to a control terminal of the multiplexer 65. A first fixed contact terminal of the switch 67 is connected to the input of the PWM frequency converter circuit 62, and a second fixed contact terminal of the switch 67 is connected to the input of the AD converter 63. The AD converter 63 is also connected to a positive electrode terminal of the voltage source 69, whose negative electrode terminal is connected to a ground line GND. The outputs of the PWM frequency converter circuit 62 and the AD converter 63 are connected via the multiplexer 65 to the input of the output signal generation circuit 64, whose output is connected to a control terminal of the switch 68. A moving contact terminal of the switch 68 is connected to a first terminal of the constant current source 662, whose other second terminal is connected to the voltage VCC line of the power supply. A fixed contact terminal of the switch 68 forms the output of the signal converter circuit 29. The output of the signal converter circuit 29 is connected to the photocoupler 45 of the feedback circuit 23. In the photocoupler 45, the output of the signal converter circuit 29 is connected to the anode of the LED 45a, whose cathode is connected to the ground line GND of the signal converter circuit 29. Note that the switches 67 and 68 are described as mechanical switches; however, they are provided in the form of semiconductor analog switches such as transmission gates.

The frequency detection circuit 61 is designed to determine whether the external control signal Cont-sig input to the control signal input terminal 32 is an analog or digital signal, and determines the external control signal Cont-sig having a frequency higher than a given frequency as a digital PWM signal. If the external control signal Cont-sig has a frequency lower than the given frequency, the frequency detection circuit 61 determines it as an analog DC voltage signal or a signal attributable to a drop in voltage in a variable resistor. According to the determination result of the frequency detection circuit 61, the switching operation of the switch 67 is performed. That is, when the external control signal Cont-sig is determined to be a PWM signal, the switch 67 is switched to the PWM frequency converter circuit 62 side. On the other hand, when the external control signal Cont-sig is determined to be a DC voltage signal or a signal attributable to a drop in voltage in a variable resistor, the switch 67 is switched to the AD converter 63 side.

When the switch 67 is switched to the PWM frequency converter circuit 62 side, the external control signal Cont-sig is frequency-multiplied by the PWM frequency converter circuit 62 to generate a PWM signal having a predetermined frequency. The generated PWM signal is output to the output signal generation circuit 64 via the multiplexer 65.

When the switch 67 is switched to the AD converter 63 side, the analog external control signal Cont-sig is converted to a digital signal by the AD converter 63. On this occasion, the AD converter 63 defines a maximum AD convertible input based on the voltage of the voltage source 69, and makes the conversion to the digital signal using the maximum input voltage as a duty cycle of 100%. The AD-converted digital signal is output to the output signal generation circuit 64 via the multiplexer 65.

The output signal generation circuit 64 generates a PWM signal with a fixed frequency, whose duty cycle changes according to the external control signal Cont-sig. On/Off control of the switch 68 is performed according to the generated PWM signal, and thereby the output signal PWM-sig generated by intermitting a constant current output from the constant current source 662 is output from the switch 68. The output signal PWM-sig is supplied to the LED 45a of the feedback circuit 23 as an output voltage adjustment signal.

Figure 3:
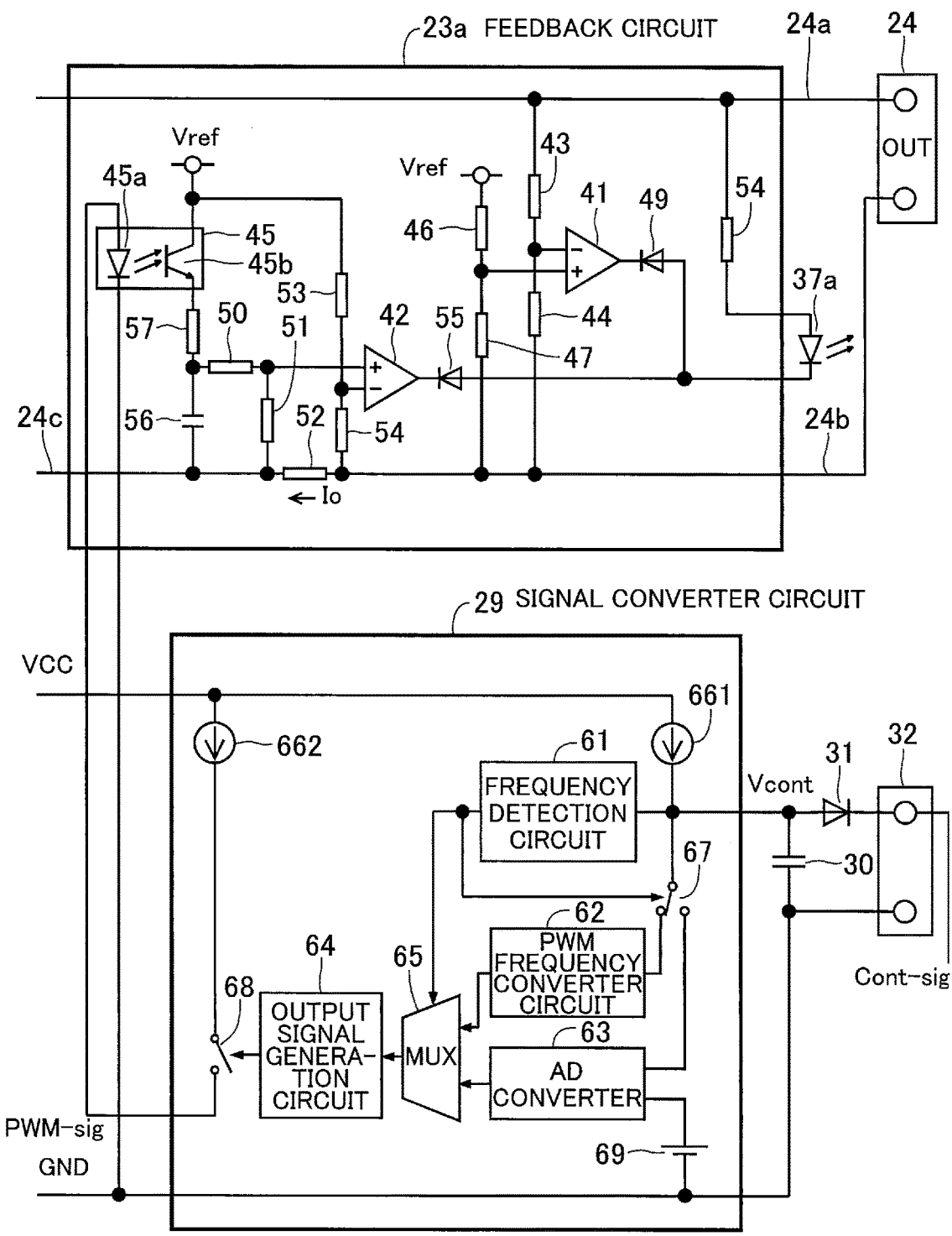
FIG. 3 is a circuit diagram illustrating a feedback circuit and a signal converter circuit of the power converter having an output current adjustment function.

FIG. 3 is a circuit diagram illustrating a feedback circuit and a signal converter circuit of a power converter having an output current adjustment function. In FIG. 3, like reference numerals are given to like components illustrated in FIG. 2, and the detailed description thereof will be omitted. Note that the signal converter circuit 29 is the same as that illustrated in FIG. 2.

As for the voltage error amplifier in a feedback circuit 23a, a fixed reference voltage source is connected to supply a reference voltage to the operational amplifier 41. The fixed reference voltage source applies, to the non-inverting input terminal of the operational amplifier 41, a constant voltage obtained by dividing the voltage Vref by the resistors 46 and 47 connected in series.

As for the current error amplifier, on the other hand, a reference voltage obtained by dividing the voltage Vref by the resistors 53 and 54 is applied to the inverting input terminal of the operational amplifier 42. In addition, a voltage generated by shifting up the voltage (negative voltage) of the line 24c, which corresponds to the output current Io, is input to the non-inverting input terminal of the operational amplifier 42. The shifted-up voltage is a positive voltage and becomes lower when the output current Io is higher. The voltage shift-up is implemented by a level shift circuit formed of the phototransistor 45b of the photocoupler 45, the resistors 50 and 51, a resistor 57, and a capacitor 56. In this level shift circuit, the electric current supplied by the voltage Vref line is intermitted by the phototransistor 45b, as in the case of the output signal PWM-sig, and the capacitor 56 is charged by the intermittent current via the resistor 57. The charged voltage averaged by the capacitor 56 and the voltage of the line 24c, which has been level-shifted by the series circuit formed of the resistors 50 and 51 and corresponds to the output current Io, are applied to the non-inverting input terminal of the operational amplifier 42. In the feedback circuit 23 of FIG. 2, the voltage connected to the series circuit of the resistors 50 and 51 is Vref and fixed; however, in the feedback circuit 23a of FIG. 3, the charged voltage of the capacitor 56 is used in place of the voltage Vref. The higher the duty ratio of the output signal PWM-sig, the higher the charged voltage of the capacitor 56 (the charged voltage reaches the maximum Vref when the duty ratio of the output signal PWM-sig is 100%), and as a result, the voltage of the line 24c, which corresponds to the output current Io, is level-shifted to a higher voltage.

According to the feedback circuit 23a, when the output voltage Vo exceeds a target voltage, the operational amplifier 41 outputs a lower voltage signal. This results in an increase in the amount of light emitted from the LED 37a, and herewith the feedback circuit 23a instructs the power supply control IC 33 to turn down its output. In addition, when the output current Io increases and a level-shifted value of the output current Io whose amount of level shift has been adjusted by the output signal PWM-sig falls below the reference voltage, the operational amplifier 42 outputs a lower voltage signal to thereby increase the amount of light emitted from the LED 37a. Herewith, the feedback circuit 23a instructs the power supply control IC 33 to reduce energy transmitted from the primary side of transformer 18 to its secondary side.

Next described is a specific configuration example of the signal converter circuit 29 which modifies each of the three types of external control signal Cont-sig input thereto and outputs the normalized output signal PWM-sig.

Figure 4:
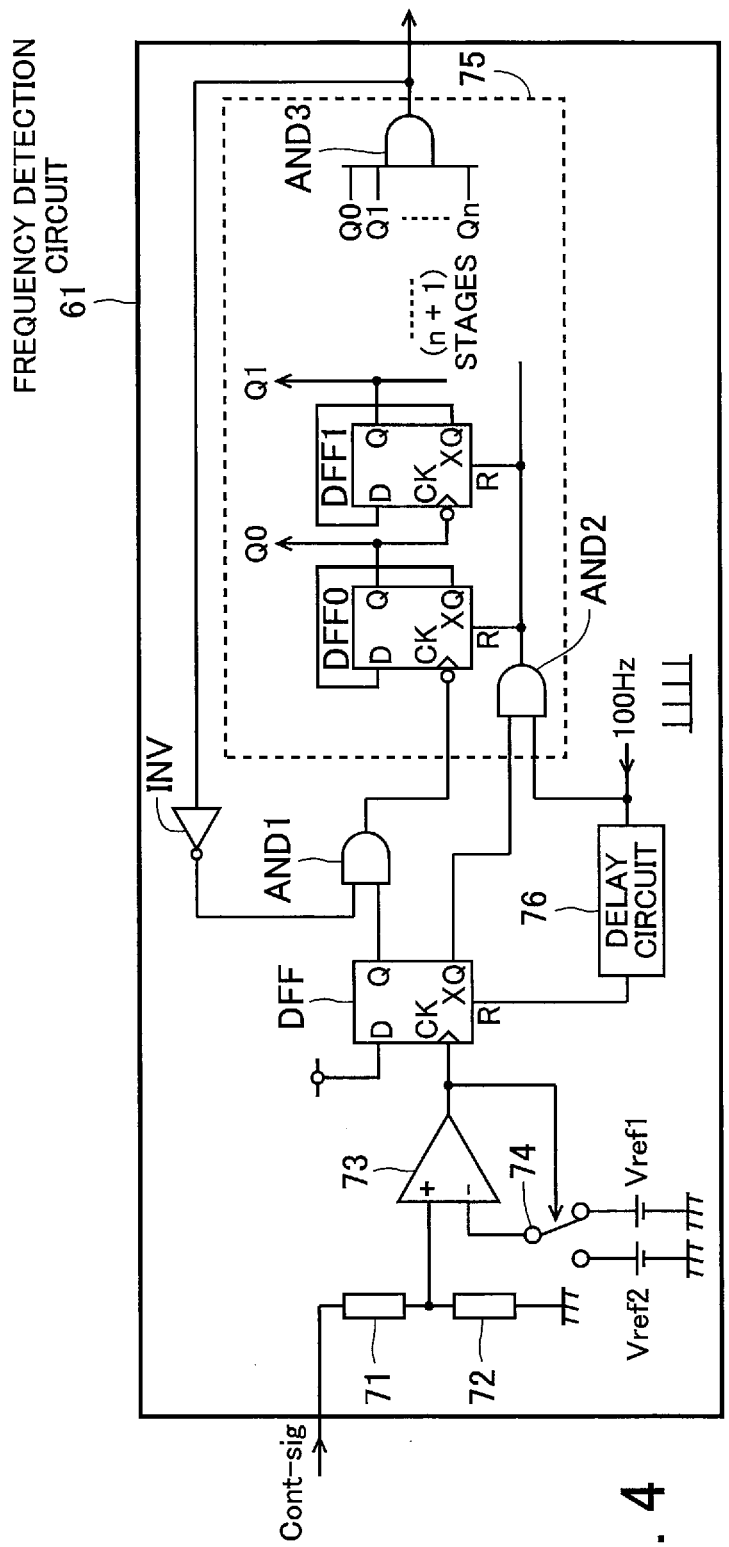
FIG. 4 is a circuit diagram illustrating a configuration example of a frequency detection circuit.

FIG. 4 is a circuit diagram illustrating a configuration example of the frequency detection circuit.

The frequency detection circuit 61 includes a hysteresis comparator in its input stage, used to binarize the external control signal Cont-sig which is input via the diode 31 and the capacitor 30. The input of the frequency detection circuit 61 is connected to a first terminal of a resistor 71, whose other second terminal is connected to a first terminal of a resistor 72 and a non-inverting input terminal of a comparator 73. The other second terminal of the resistor 72 is connected to ground. An inverting input terminal of the comparator 73 is connected to a moving contact terminal of a switch 74, whose first and second fixed contact terminals are connected to reference voltage sources Vref1 and Vref2, respectively. An output terminal of the comparator 73 is connected to a control terminal of the switch 74. Voltages Vref1 and Vref2 of the reference voltage sources Vref1 and Vref2 have a relationship of Vref1>Vref2.

The output terminal of the comparator 73 is also connected to a clock input (CK) of a D flip-flop DFF. As for the D flip-flop DFF, a data input terminal (D) is connected to a power supply line of the frequency detection circuit 61, a non-inverted output (Q output) is connected to a first input of an AND circuit AND1, and an inverted output (XQ output) is connected to a first input terminal of an AND circuit AND2 of a frequency division circuit 75. A reset input of the D flip-flop DFF is connected to the output of a delay circuit 76. The input of the delay circuit 76 and the other second input of the AND circuit AND2 are connected to the output of an oscillator circuit (not illustrated) for generating a short-pulse reset signal (reset pulses) and, for example, a 100-Hz pulse signal is input thereto.

The frequency division circuit 75 includes (n+1) D flip-flops DFF0 to DFFn and an AND circuit AND3 for inputting thereto outputs of all the D flip-flops DFF0 to DFFn. The D flip-flops DFF0 to DFFn make up a counter circuit, and the output of the AND circuit AND1 is connected to a clock input of the D flip-flop DFF0 at the initial stage. Reset inputs of the D flip-flops DFF0 to DFFn are connected to the output of the AND circuit AND2.

The output of the AND circuit AND3, which is the output of the frequency division circuit 75, is connected to the input of an inverter circuit INV, whose output is connected to the other second input of the AND circuit AND1.

According to the frequency detection circuit 61, first, the voltage of the external control signal Cont-sig input to the first terminal of the resistor 71 is divided by the resistors 71 and 72, and a value obtained by the voltage division is compared by the comparator 73 against the voltages Vref1 and Vref2. The comparator 73 outputs a binarized signal at HIGH level when the obtained value reaches or exceeds the voltage Vref1 and at LOW level when the obtained value falls below the voltage Vref2. The comparator 73 functions as a hysteresis comparator that inputs, by the assistance of the switch 74, the voltage Vref2 to its inverting input terminal when the output is at HIGH level and the voltage Vref1 to the inverting input terminal when the output is at L level.

The output of the comparator 73 is input to the clock input of the D flip-flop DFF. To the reset input of the D flip-flop DFF, a signal obtained by delaying the 100-Hz clock signal using the delay circuit 76 is input. Therefore, the level of the Q output of the D flip-flop DFF is switched from LOW level to HIGH level when the output of the comparator 73 changes from LOW level to HIGH level. If the output of the comparator 73 changes from LOW level to HIGH level at a frequency lower than the frequency of the reset signal (i.e. 100 Hz), the Q output of the D flip-flop DFF is also switched from LOW level to HIGH level in every cycle.

The Q output of the D flip-flop DFF is input to the first input of the AND circuit AND1. To the second input of the AND circuit AND1, a value obtained by inverting the output of the frequency division circuit 75 using the inverter circuit INV is input. When the output of the frequency division circuit 75 (i.e., logical AND of Q0, Q1, . . . , Qn) is at LOW level, a signal from the Q output of the D flip-flop DFF is input to the clock input of the D flip-flop DFF0 of the counter circuit, which then starts counting up. If a reset pulse occurs when the XQ output of the D flip-flop DFF is at LOW level, the output of the AND circuit AND2 remains at LOW level because the D flip-flop DFF is not immediately reset by the delay circuit 76, and therefore the frequency division circuit 75 is not reset. The D flip-flop DFF is reset by the delay circuit 76 after the reset pulse disappears; however, if the output of the comparator 73 again changes from LOW level to HIGH level before the next reset pulse arrives, the XQ output of the D flip-flop DFF changes to LOW level again and the frequency division circuit 75 is still not reset by the next reset pulse. That is, the counter circuit continues to count up when the frequency of the external control signal Cont-sig is higher than or equal to 100 Hz; however, it is reset if the frequency falls below 100 Hz.

When the counter circuit has reached its maximum count number, the frequency division circuit 75 outputs a HIGH-level signal. The HIGH-level output is inverted by the inverter circuit INV to be a LOW-level signal, which changes one of the inputs of the AND circuit AND1 to LOW level. Herewith, the clock input of the counter circuit changes to LOW level, and the AND circuit AND1 prevents the signal from the Q output of the D flip-flop DFF from passing therethrough. As a result, the frequency division circuit 75 maintains the maximum count number and thus maintains the output of a HIGH-level determination signal indicating that the external control signal Cont-sig is a PWM signal. Note however that, if the comparator 73 is not able to continue the inverting operation of the output from LOW to HIGH level in each cycle, the counter circuit of the frequency division circuit 75 is reset and a clock input is allowed from this point on.

The above-described circuit detects the external control signal Cont-sig with a frequency higher than 100 Hz; however, the reset frequency being 100 Hz is merely an example and the reset frequency is not limited to the example. It is possible to respond to the external control signal Cont-sig of any frequency by changing the reset frequency. When the output of the frequency detection circuit 61 is at HIGH level, the external control signal Cont-sig is connected to the PWM frequency converter circuit 62. When the output of the frequency detection circuit 61 is at LOW level, on the other hand, the external control signal Cont-sig is connected to the AD converter 63.

Figure 5:
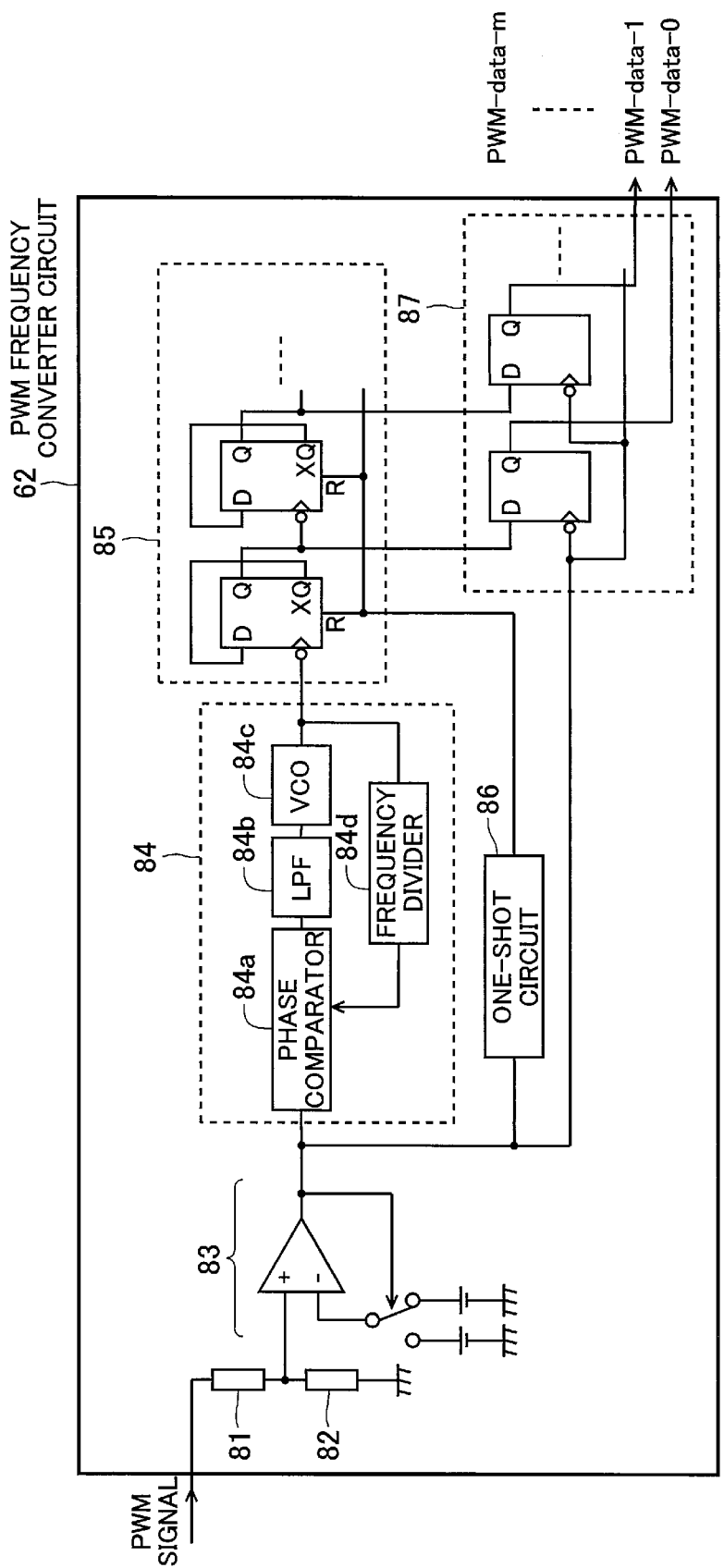
FIG. 5 is a circuit diagram illustrating a configuration example of a PWM frequency converter circuit.
Figure 6:
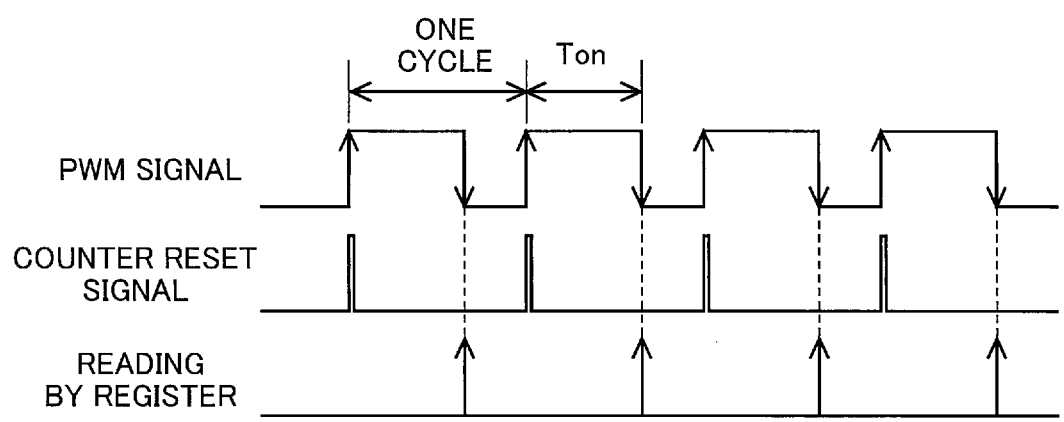
FIG. 6 is a timing chart illustrating operation of the PWM frequency converter circuit.

FIG. 5 is a circuit diagram illustrating a configuration example of the PWM frequency converter circuit, and FIG. 6 is a timing chart illustrating operation of the PWM frequency converter circuit.

To the input of the PWM frequency converter circuit 62, a voltage divider circuit formed of resistors 81 and 82 is connected. To the output of the voltage divider circuit, a hysteresis comparator 83 is connected. The hysteresis comparator 83 has the same configuration as the hysteresis comparator of the frequency detection circuit 61 and is designed to output a binarized signal in phase with the external control signal Cont-sig. Note that the resistors 81 and 82 and the hysteresis comparator 83 may be replaced by the resistors 71 and 72, the comparator 73, the switch 74, and the reference voltage sources Vref1 and Vref2 of the frequency detection circuit 61 illustrated in FIG. 4 (that is, the frequency detection circuit 61 and the PWM frequency converter circuit 62 share the voltage divider circuit and the hysteresis comparator).

The output of the hysteresis comparator 83 is connected to the input of a phase locked loop (PLL) 84. The PLL 84 includes a phase comparator 84a, a low-pass filter (LPF) 84b, a voltage controlled oscillator (VCO) 84c, and a frequency divider 84d. The phase comparator 84a receives output signals from the hysteresis comparator 83 and the frequency divider 84d and detects a phase difference at the rise of these two signals. The output of the phase comparator 84a is connected to the input of the LPF 84b. The LPF 84b averages a phase difference signal with ripples, output from the phase comparator 84a, and converts it to a DC voltage signal. The output of the LPF 84b is connected to the input of the VCO 84c. The VCO 84c outputs a pulse signal with a frequency corresponding to the voltage value of the input DC voltage signal. The frequency divider 84d reduces the frequency of the pulse signal output from the VCO 84c and then inputs the pulse signal to the phase comparator 84a.

According to the PLL 84, the frequency of the PWM signal input to the phase comparator 84a and the frequency obtained by dividing the frequency of the output from the VCO 84c become synchronized with each other. That is, the oscillation frequency of the VCO 84c is controlled to be a frequency obtained by multiplying the frequency of the PWM signal by the number of frequency divisions of the frequency divider 84d.

The output of the PLL 84 is connected to the input of an asynchronous (m+1)-bit counter 85. The counter 85 is implemented, for example, by sequentially connecting (m+1) D flip-flops.

The output of the hysteresis comparator 83 is also connected to the input of a one-shot circuit 86, whose output is input to the counter 85 as a reset signal.

The PWM frequency converter circuit 62 further includes an (m+1)-bit register 87 for storing bit outputs from the counter 85. The register 87 includes (m+1) D flip-flops, whose data input terminals are individually connected with Q outputs of the D flip-flops making up the counter 85. To clock inputs of the register 87, the output of the hysteresis comparator 83 is connected. Note that since the clock inputs of the register 87 are negative logic, the clock is input to the register 87 at the fall of the output signal from the hysteresis comparator 83.

According to the PWM frequency converter circuit 62, the external control signal Cont-sig input thereto is wave-shaped by the hysteresis comparator 83 and converted to a PWM signal illustrated in FIG. 6. In this instance, the PLL 84 outputs a pulse signal with a frequency obtained by multiplying the frequency of the PWM signal by the number of frequency divisions of the frequency divider 84d. For example, assuming that the number of frequency division stages of the frequency divider 84d (the number of ½ frequency dividers (e.g. D flip-flops) making up the frequency divider 84d) is p, the signal output from the PLL 84 is a pulse signal obtained by multiplying the frequency of the PWM signal by $2^p$ ($p \leq (m+1)$).

The pulse signal output from the PLL 84 is input to the counter 85 and then counted. Note that the counter 85 starts counting when a reset signal output from the one-shot circuit 86 at the rise of the PWM signal is input, as illustrated in FIG. 6.

Next, the counted value is read by the register 87 while the counter 85 continues counting of pulse signals. The reading of the counted value takes place at each falling edge of the PWM signal, as illustrated in FIG. 6. Herewith, the register 87 reads the counted value obtained by the counter 85 during ON time Ton in each cycle of the PWM signal and then stores the read counted value therein. The stored counted value is output from the register 87 in the form of an (m+1)-bit digital signal, PWM-data-0 to PWM-data-m. Thus, the duty cycle of the PWM signal is detected by obtaining the data representing ON time Ton of the PWM signal. Note here that the duty cycle is calculated by dividing the value of the register 87 by $2^p$. Assume in the following that p=(m+1).

The connections of the inverting input and non-inverting input of the hysteresis comparator 83 may be reversed so that the inputs of the phase comparator 84a and the one-shot circuit 86 are negative logic and the clock inputs of the register 87 are positive logic. In this case, the rising and falling timings of the PWM signal output from the hysteresis comparator 83 are reversed; however, the same results are produced.

Figure 7:
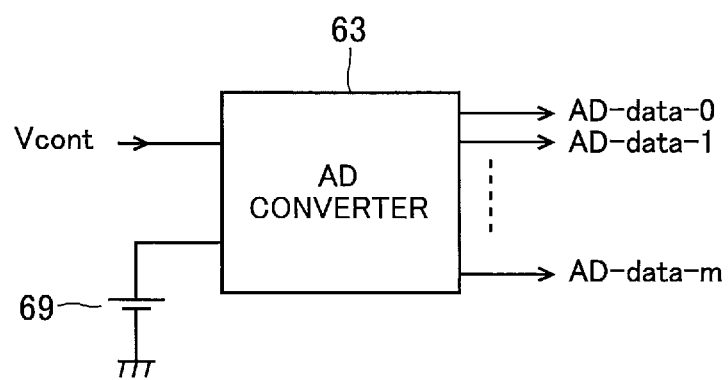
FIG. 7 illustrates an AD converter.

FIG. 7 illustrates the AD converter.

The AD converter 63 receives the voltage Vcont determined by the analog external control signal Cont-sig attributable to application of a DC voltage or a drop in voltage in a variable resistor and converts the ratio of the voltage Vcont to the maximum voltage into a digital signal. The resolution of the AD converter 63 is set to (m+1) bits in accordance with the number of bits of the data output from the PWM frequency converter circuit 62. Therefore, the AD converter 63 outputs a digital signal AD-data-0 to AD-data-m representing the external control signal Cont-sig in (m+1) bits. The digital signal AD-data-0 to AD-data-m represents an adjustment ratio for the power converter according to the external control signal Cont-sig, and corresponds to the duty cycle of the PWM signal output from the PWM frequency converter circuit 62.

The AD converter 63 receives a voltage supplied by the voltage source 69 as a reference voltage. Herewith, the upper limit of a DC voltage range for the AD converter 63 with (m+1) bit resolution to carry out AD conversion is defined.

Figure 8:
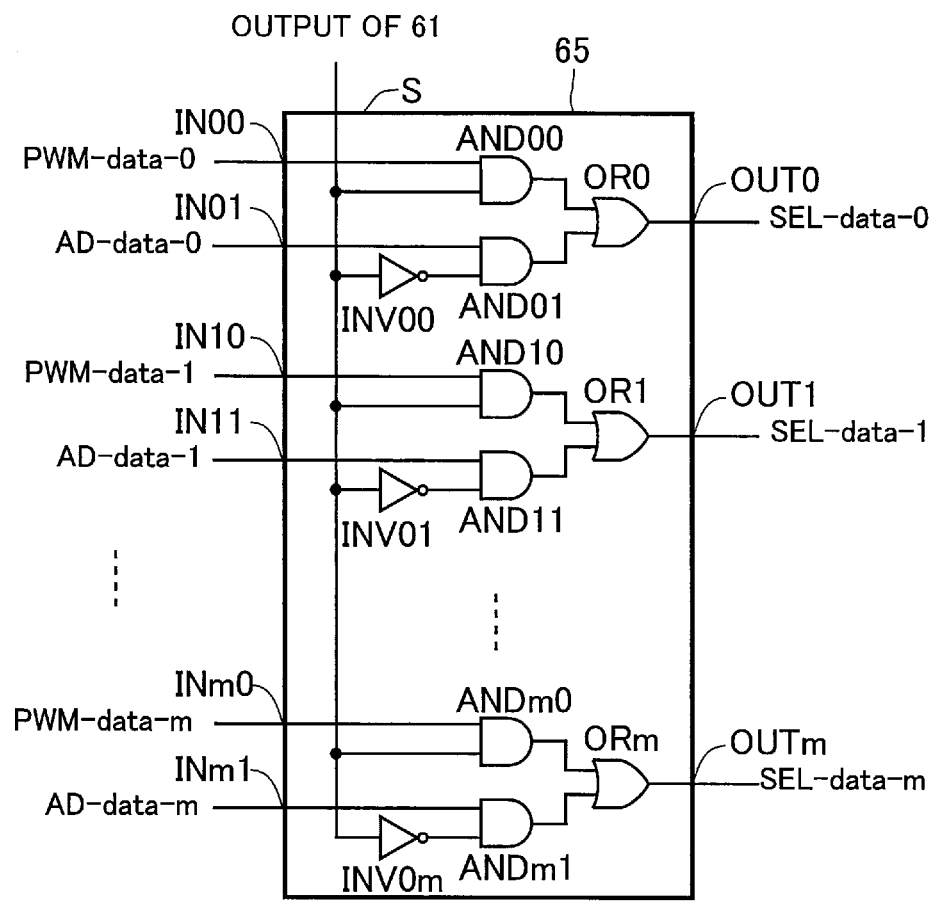
FIG. 8 is a circuit diagram illustrating a configuration example of a multiplexer.

FIG. 8 is a circuit diagram illustrating a configuration example of the multiplexer.

The multiplexer 65 is a circuit for selecting one of the output of the PWM frequency converter circuit 62 and the output of the AD converter 63 based on the output signal of the frequency detection circuit 61. The multiplexer 65 includes input terminals IN00 to INm0 for receiving the digital signal PWM-data-0 to PWM-data-m output from the PWM frequency converter circuit 62. The multiplexer 65 also includes input terminals IN01 to INm1 for receiving the digital signal AD-data-0 to AD-data-m output from the AD converter 63. The multiplexer 65 further includes output terminals OUT0 to OUTm and a selector terminal S for receiving the output signal of the frequency detection circuit 61.

The input terminals IN00 to INm0 for the digital signal PWM-data-0 to PWM-data-m are connected to respective first inputs of AND circuits AND00 to ANDm0, whose other second inputs are connected to the selector terminal S. The input terminals IN01 to INm1 for the digital signal AD-data-0 to AD-data-m are connected to respective first inputs of AND circuits AND01 to ANDm1, whose other second inputs are connected to the respective outputs of inverter circuits INV00 to INV0m. The inputs of the inverter circuits INV00 to INV0m are connected to the selector terminal S. The outputs of the AND circuits AND00 to ANDm0 and the AND circuits AND01 to ANDm1 are connected to the inputs of OR circuits OR0 to ORm, whose outputs are connected to the output terminals OUT0 to OUTm, respectively. From the output terminals OUT0 to OUTm, a selected digital signal SEL-data-0 to SEL-data-m is output.

To the selector terminal S of the multiplexer 65, a binary output signal according to whether the frequency detection circuit 61 has detected a PWM signal is input. Assume in this embodiment that the frequency detection circuit 61 outputs a HIGH-level output signal when having determined that the external control signal Cont-sig is a PWM signal and outputs a LOW-level output signal when having determined that the external control signal Cont-sig is not a PWM signal.

In the case where a HIGH-level output signal is input to the selector terminal S, the AND circuits AND00 to ANDm0 allow the digital signal PWM-data-0 to PWM-data-m to pass therethrough while the AND circuits AND01 to ANDm1 prevent the digital signal AD-data-0 to AD-data-m from passing therethrough. Therefore, the digital signal PWM-data-0 to PWM-data-m is carried to the output terminals OUT0 to OUTm via the OR circuits OR0 to ORm and then output therefrom as the digital signal SEL-data-0 to SEL-data-m.

On the other hand, in the case where a LOW-level output signal is input to the selector terminal S, the AND circuits AND00 to ANDm0 prevent the digital signal PWM-data-0 to PWM-data-m from passing therethrough while the AND circuits AND01 to ANDm1 allow the digital signal AD-data-0 to AD-data-m to pass therethrough. Therefore, the digital signal AD-data-0 to AD-data-m is carried to the output terminals OUT0 to OUTm via the OR circuits OR0 to ORm and then output therefrom as the digital signal SEL-data-0 to SEL-data-m.

Figure 9:
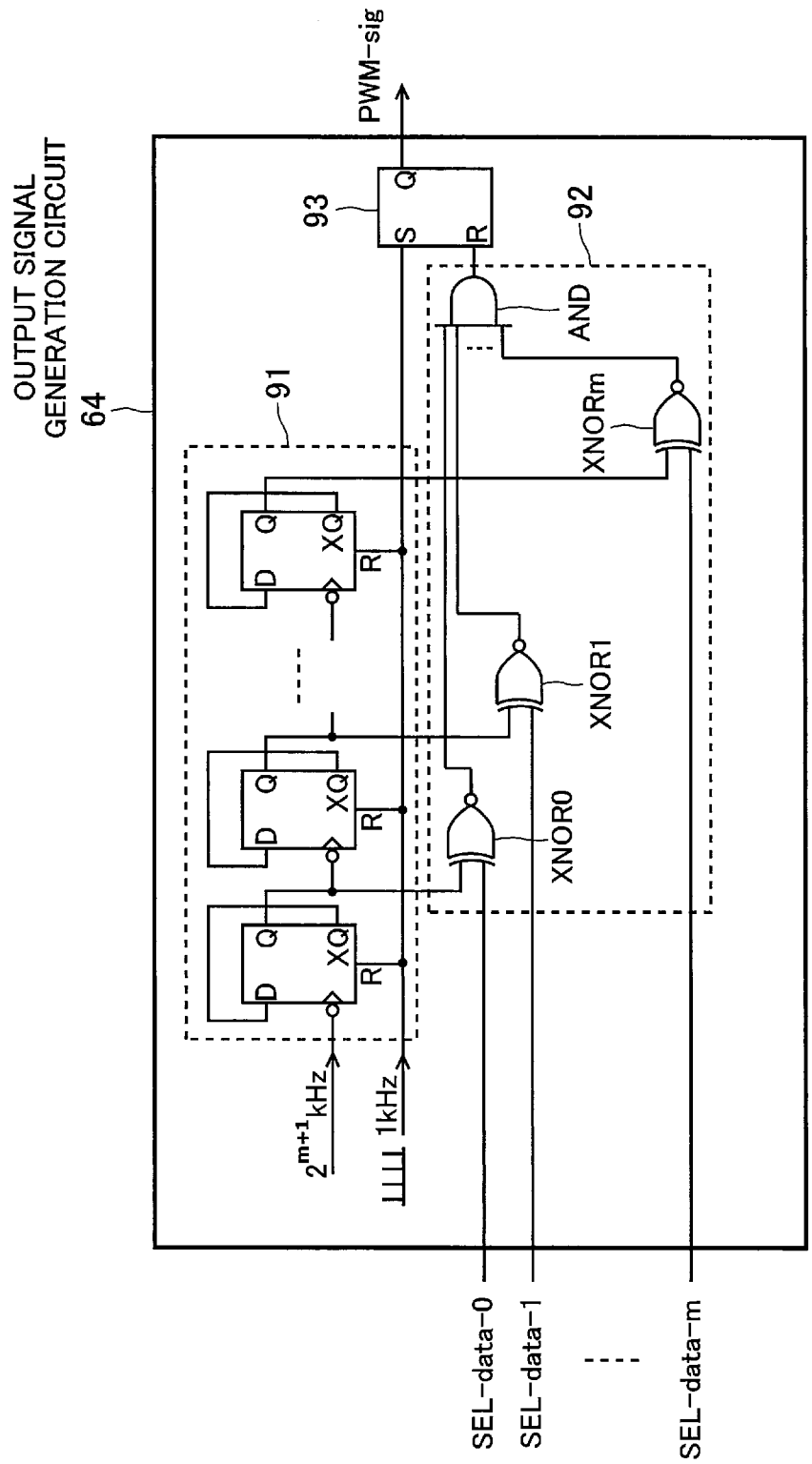
FIG. 9 is a circuit diagram illustrating a configuration example of an output signal generation circuit.
Figure 10:
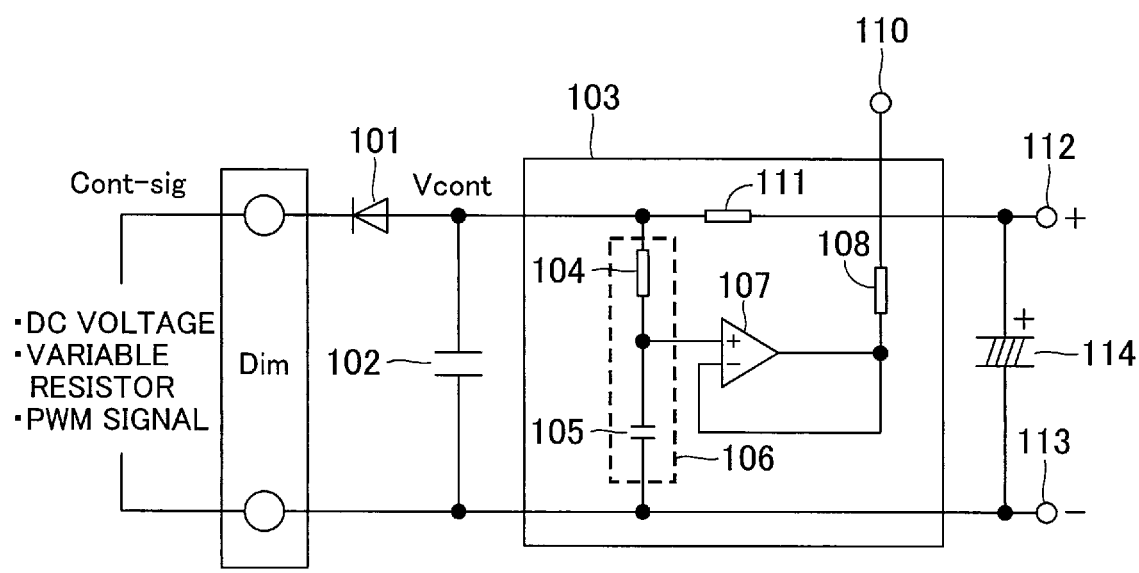
FIG. 10 is a circuit diagram illustrating a configuration example of a conventional input circuit to which an analog or digital signal is input.

FIG. 9 is a circuit diagram illustrating a configuration example of the output signal generation circuit.

The output signal generation circuit 64 includes an (m+1)-bit counter 91, a data matching circuit 92, and an RS flip-flop 93. The output signal generation circuit 64 generates the output signal PWM-sig with the same duty cycle as that detected by the PWM frequency converter circuit 62 and the AD converter 63. Note however that the output signal PWM-sig is set to a frequency (1 kHz in the illustrated example) according to characteristics of a CR filter (low-pass filter) formed of the resistor 46 and the capacitor 48 of the feedback circuit 23 or a CR filter (low-pass filter) formed of the resistor 57 and the capacitor 56 of the feedback circuit 23a.

The counter 91 includes (m+1) D flip-flops, in each of which its XQ output is connected to its data input terminal. In addition, to a clock terminal (negative logic) of each of the D flip-flops of the second and subsequent stages, a Q output of the D flip-flop in the previous stage is connected. As for the counter 91, a $2^{\wedge}(m+1)$-kHz clock signal and a 1-kHz reset signal are input.

The data matching circuit 92 compares the digital signal SEL-data-0 to SEL-data-m selected by the multiplexer 65 with the output signals of the individual D flip-flops in the counter 91, and outputs a HIGH-level match signal only when exact data match is found in all the bits. The data matching circuit 92 in this example employs exclusive NOR circuits XNOR0 to XNORm for the bit-by-bit comparison and uses an AND circuit AND to determine whether the outputs of all the exclusive NOR circuits XNOR0 to XNORm indicate a match. Note that each of the exclusive NOR circuits is a circuit which outputs a HIGH-level signal when the two inputs match and outputs a LOW-level signal when they disagree.

As for the RS flip-flop 93, a 1-kHz pulse signal which is the reset signal for the counter 91 is input to its set input terminal, and the output signal of the data matching circuit 92 is input to its reset input terminal. Therefore, the RS flip-flop 93 outputs a HIGH-level signal each time a 1-kHz pulse signal is input thereto, and the HIGH-level output is maintained until the counted value of the counter 91 matches data of the duty cycle read by the multiplexer 65. Herewith, the output signal generation circuit 64 outputs the output signal PWM-sig with the same duty cycle as indicated by the external control signal Cont-sig.

In the feedback circuit 23 having received the output signal PWM-sig, the target output voltage for the output voltage Vo is set to a voltage corresponding to the duty cycle. In the feedback circuit 23a having received the output signal PWM-sig, the upper limit of the output current Io is set to an electric current corresponding to the duty cycle.

As has been described above, the signal output from the output signal generation circuit 64 is always a 1-kHz PWM signal regardless of the type of external control signal Cont-sig, which therefore allows all circuits in the subsequent stages to be shared. In addition, because the signal output from the output signal generation circuit 64 has a frequency of 1 kHz, there is no need of a low-pass filter with a large time constant, and there is therefore no risk of causing a delay that affects the startup time. Note that the frequency of the signal output from the output signal generation circuit 64 is set to 1 kHz in this embodiment; however, the frequency is not limited to this.

In addition, in the signal converter circuit 29 according to the above-described embodiment, the switch 67 is provided on the input side of the PWM frequency converter circuit 62 and the AD converter 63 to implement changeover of the external control signal Cont-sig transmission between them. However, the switch 67 is not indispensable in the case where the PWM frequency converter circuit 62 and the AD converter 63 operate with no mutual interference when the external control signal Cont-sig is input thereto at the same time.

According to the power converter having the above-described configuration, the signal converter circuit for inputting an external control signal thereto is configured to output a digital output signal regardless of whether the input external control signal is analog or digital. This allows supply of a stable signal unaffected by the voltage value of a PWM signal at HIGH level or the like. In addition, setting the frequency of the output signal high eliminates the need of providing a low-pass filter with a large time constant for the feedback circuit, and there is therefore no risk of causing a delay in the startup.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power converter comprising:
a signal converter circuit configured to receive an external control signal which is one of a pulse width modulation signal and a direct-current voltage, and to adjust a threshold used by a feedback circuit to detect an output voltage or electric current to be supplied to a load, wherein
the signal converter circuit includes
a frequency detection circuit configured to determine whether the external control signal is the pulse width modulation signal,
a pulse width modulation frequency converter circuit configured to detect a duty cycle of the pulse width modulation signal and to generate a first digital signal based on the detected duty cycle,
an analog-to-digital converter configured to generate a second digital signal based on a ratio of the direct-current voltage to a maximum analog-to-digital convertible input voltage,
a multiplexer configured to select the first digital signal when the frequency detection circuit determines that the external control signal is the pulse width modulation signal, and to select the second digital signal when the frequency detection circuit determines that the external control signal is not the pulse width modulation signal, and
an output signal generation circuit configured to generate as an output signal a first output pulse width modulation signal with a first duty cycle based on the first digital signal when the first digital signal is selected by the multiplexer and to generate as the output signal a second output pulse width modulation signal- with a second duty cycle based on the second digital signal when the second digital signal is selected by the multiplexer, and to supply the output signal to the feedback circuit, such that the output signal has the first duty cycle when the external control signal is the pulse width modulation signal, and has the second duty cycle when the external control signal is the direct current voltage.

2. A power converter comprising:
a signal converter circuit configured to receive an external control signal which is one of a pulse width modulation signal and a direct-current voltage, and to adjust a threshold used by a feedback circuit to detect an output voltage or electric current to be supplied to a load, wherein
the signal converter circuit includes
a frequency detection circuit configured to determine whether the external control signal is the pulse width modulation signal, the frequency detection circuit binarizing the external control signal and determining that the external control signal is in the form of the pulse width modulation signal when the binarized signal has a frequency higher than a predetermined frequency,
a pulse width modulation frequency converter circuit configured to detect a duty cycle of the pulse width modulation signal and to generate a first digital signal based on the detected duty cycle,
an analog-to-digital converter configured to generate a second digital signal based on a ratio of the direct-current voltage to a maximum analog-to-digital convertible input voltage,
a multiplexer configured to select the first digital signal when the frequency detection circuit determines that the external control signal is the pulse width modulation signal, and to select the second digital signal when the frequency detection circuit determines that the external control signal is not the pulse width modulation signal, and
an output signal generation circuit configured to generate as an output signal a first output pulse width modulation signal with a first duty cycle based on the first digital signal when the first digital signal is selected by the multiplexer and to generate as the output signal a second output pulse width modulation signal- with a second duty cycle based on the second digital signal when the second digital signal is selected by the multiplexer, and to supply the output signal to the feedback circuit.

3. A power converter comprising:
a signal converter circuit configured to receive an external control signal which is one of a pulse width modulation signal and a direct-current voltage, and to adjust a threshold used by a feedback circuit to detect an output voltage or electric current to be supplied to a load, wherein
the signal converter circuit includes
a frequency detection circuit configured to determine whether the external control signal is the pulse width modulation signal,
a pulse width modulation frequency converter circuit configured to detect a duty cycle of the pulse width modulation signal and to generate a first digital signal based on the detected duty cycle,
an analog-to-digital converter configured to generate a second digital signal based on a ratio of the direct-current voltage to a maximum analog-to-digital convertible input voltage,
a multiplexer configured to select the first digital signal when the frequency detection circuit determines that the external control signal is the pulse width modulation signal, and to select the second digital signal when the frequency detection circuit determines that the external control signal is not the pulse width modulation signal, and
an output signal generation circuit configured to generate as an output signal a first output pulse width modulation signal with a first duty cycle based on the first digital signal when the first digital signal is selected by the multiplexer and to generate as the output signal a second output pulse width modulation signal- with a second duty cycle based on the second digital signal when the second digital signal is selected by the multiplexer, and to supply the output signal to the feedback circuit the frequency detection circuit including
a hysteresis comparator configured to binarize the external control signal,
a flip-flop configured to be set by an output signal of the hysteresis comparator and reset by a signal obtained by delaying a reset signal with a predetermined frequency,
a frequency division circuit configured to divide a frequency of an output signal of the flip-flop, to be reset by a logical AND signal indicating a logical AND between the reset signal and an inverted output signal of the flip-flop, and to output a determination signal indicating that the external control signal is the pulse width modulation signal when the output signal of the flip-flop is counted a predetermined number of times without being reset, and an AND circuit configured to inhibit, when the frequency division circuit outputs the determination signal, an input of the output signal of the flip-flop and to maintain the output of the determination signal.

4. A power converter comprising:

a signal converter circuit configured to receive an external control signal which is one of a pulse width modulation signal and a direct-current voltage, and to adjust a threshold used by a feedback circuit to detect an output voltage or electric current to be supplied to a load, wherein the signal converter circuit includes
- a frequency detection circuit configured to determine whether the external control signal is the pulse width modulation signal,
- a pulse width modulation frequency converter circuit configured to detect a duty cycle of the pulse width modulation signal and to generate a first digital signal based on the detected duty cycle,
- an analog-to-digital converter configured to generate a second digital signal based on a ratio of the direct-current voltage to a maximum analog-to-digital convertible input voltage,
- a multiplexer configured to select the first digital signal when the frequency detection circuit determines that the external control signal is the pulse width modulation signal, and to select the second digital signal when the frequency detection circuit determines that the external control signal is not the pulse width modulation signal, and
- an output signal generation circuit configured to generate as an output signal a first output pulse width modulation signal with a first duty cycle based on the first digital signal when the first digital signal is selected by the multiplexer and to generate as the output signal a second output pulse width modulation signal- with a second duty cycle based on the second digital signal when the second digital signal is selected by the multiplexer, and to supply the output signal to the feedback circuit the pulse width modulation frequency converter circuit including
  - a hysteresis comparator configured to binarize the pulse width modulation signal,
  - a phase locked loop configured to frequency-multiply an output signal of the hysteresis comparator,
  - a counter configured to count an output signal of the phase locked loop and to be reset at a rise or a fall of the output signal of the hysteresis comparator, and
  - a register configured to read a counted value of the counter at the fall or the rise of the output signal of the hysteresis comparator and to output the read counted value as the first digital signal representing the detected duty cycle of the pulse width modulation signal.

5. A power converter comprising:

a signal converter circuit configured to receive an external control signal which is one of a pulse width modulation signal and a direct-current voltage, and to adjust a threshold used by a feedback circuit to detect an output voltage or electric current to be supplied to a load, wherein the signal converter circuit includes
- a frequency detection circuit configured to determine whether the external control signal is the pulse width modulation signal,
- a pulse width modulation frequency converter circuit configured to detect a duty cycle of the pulse width modulation signal and to generate a first digital signal based on the detected duty cycle,
- an analog-to-digital converter configured to generate a second digital signal based on a ratio of the direct-current voltage to a maximum analog-to-digital convertible input voltage,
- a multiplexer configured to select the first digital signal when the frequency detection circuit determines that the external control signal is the pulse width modulation signal, and to select the second digital signal when the frequency detection circuit determines that the external control signal is not the pulse width modulation signal, and
- an output signal generation circuit configured to generate as an output signal a first output pulse width modulation signal with a first duty cycle based on the first digital signal when the first digital signal is selected by the multiplexer and to generate as the output signal a second output pulse width modulation signal- with a second duty cycle based on the second digital signal when the second digital signal is selected by the multiplexer, and to supply the output signal to the feedback circuit the output signal generation circuit including
  - a counter configured to receive and count a clock signal with a second frequency higher than a first frequency of the output signal to be supplied to the feedback circuit, and to be reset by a signal with the first frequency,
  - a data matching circuit configured to compare a counted value of the counter with the first digital signal or the second digital signal and output a match signal when the counted value and a value of the first digital signal or the second digital signal match, and
  - a flip-flop configured to be set upon receiving the signal with the first frequency and reset upon receiving the match signal and then output the output signal to the feedback circuit.

6. A power converter comprising:

a signal converter circuit configured to receive an external control signal which is one of a pulse width modulation signal and a direct-current voltage, and to adjust a threshold used by a feedback circuit to detect an output voltage or electric current to be supplied to a load, wherein the signal converter circuit includes
- a frequency detection circuit configured to determine whether the external control signal is the pulse width modulation signal,
- a pulse width modulation frequency converter circuit configured to detect a duty cycle of the pulse width modulation signal and to generate a first digital signal based on the detected duty cycle,
- an analog-to-digital converter configured to generate a second digital signal based on a ratio of the direct-current voltage to a maximum analog-to-digital convertible input voltage, a multiplexer configured to select the first digital signal when the frequency detection circuit determines that the external control signal is the pulse width modulation signal, and to select the second digital signal when the frequency detection circuit determines that the external control signal is not the pulse width modulation signal, an output signal generation circuit configured to generate as an output signal a first output pulse width modulation signal with a first duty cycle based on the first digital signal when the first digital signal is selected by the multiplexer and to generate as the output signal a second output pulse width modulation signal- with a second duty cycle based on the second digital signal when the second digital signal is selected by the multiplexer, and to supply the output signal to the feedback circuit, and a switch configured to supply the external control signal to the pulse width modulation frequency converter circuit when the frequency detection circuit determines that the external control signal is the pulse width modulation signal and to supply the external control signal to the analog-to-digital converter when the frequency detection circuit determines that the external control signal is not the pulse width modulation signal.

7. The power converter according to claim 1, wherein the load is a light-emitting diode used for lighting.

8. A power converter comprising:
a feedback circuit configured to be coupled to a load; and
a signal converter circuit configured to receive one of a pulse width modulation signal and a direct-current voltage as an external control signal, and to provide an output signal to the feedback circuit to adjust a threshold used by the feedback circuit to detect an output voltage or an electric current to be supplied to the load, the signal converter circuit providing, as the output signal to the feedback circuit, one of a first output pulse width modulation signal of a predetermined frequency and a second output pulse width modulation signal of the predetermined frequency based on the external control signal, the output signal having a first duty ratio when the external control signal is the pulse width modulation signal, and having a second duty ratio when the external control signal is the direct-current voltage.

9. The power converter according to claim 8, wherein the load is a light-emitting diode used for lighting.

10. The power converter according to claim 1, wherein the first duty cycle is indicated by the first digital signal.

11. The power converter according to claim 1, wherein the second duty cycle is indicated by the second digital signal.

12. The power converter according to claim 8, wherein the first duty ratio is indicated by the first digital signal.

13. The power converter according to claim 8, wherein the second duty ratio is indicated by the second digital signal.

* * * * *